(12) United States Patent
Ham et al.

(10) Patent No.: US 11,430,737 B2
(45) Date of Patent: Aug. 30, 2022

(54) FLEXIBLE PRINTED CIRCUIT BOARD WITH EMBEDDED ELECTRONIC ELEMENT

(71) Applicant: SAMSUNG ELECTRO-MECHANICS CO., LTD., Suwon-si (KR)

(72) Inventors: Ho-Hyung Ham, Suwon-si (KR); Sa-Yong Lee, Suwon-si (KR); Ju-Ho Kim, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 75 days.

(21) Appl. No.: 16/537,923

(22) Filed: Aug. 12, 2019

(65) Prior Publication Data

US 2020/0176386 A1 Jun. 4, 2020

(30) Foreign Application Priority Data

Dec. 4, 2018 (KR) .......................... 10-2018-0154648

(51) Int. Cl.
*H01L 23/538* (2006.01)
*H01L 23/00* (2006.01)
*H01L 21/48* (2006.01)

(52) U.S. Cl.
CPC ...... *H01L 23/5387* (2013.01); *H01L 21/4853* (2013.01); *H01L 21/4857* (2013.01); *H01L 23/5383* (2013.01); *H01L 23/5386* (2013.01); *H01L 23/5389* (2013.01); *H01L 24/19* (2013.01); *H01L 24/20* (2013.01); *H01L 2224/214* (2013.01)

(58) Field of Classification Search
CPC ............. H01L 23/5387; H01L 23/5383; H01L 23/5386; H01L 23/5389; H01L 24/19; H01L 24/20; H01L 21/4853; H01L 21/4857; H01L 2224/214; H05K 3/4691
USPC ........................................................ 257/668
See application file for complete search history.

(56) References Cited

U.S. PATENT DOCUMENTS

| | | | | |
|---|---|---|---|---|
| 5,428,190 A | * | 6/1995 | Stopperan | H05K 1/148 174/250 |
| 7,154,175 B2 | * | 12/2006 | Shrivastava | H01L 23/5387 257/E23.079 |
| 7,902,676 B2 | * | 3/2011 | Chia | H05K 1/185 438/105 |
| 8,461,693 B2 | * | 6/2013 | Lim | H01L 23/5387 438/109 |
| 9,030,006 B2 | * | 5/2015 | Chow | H01L 23/3128 257/726 |
| 2009/0016032 A1 | * | 1/2009 | Chow | H01L 25/105 361/749 |
| 2011/0199739 A1 | * | 8/2011 | Naganuma | H05K 3/4691 361/749 |

(Continued)

*Primary Examiner* — Khiem D Nguyen
*Assistant Examiner* — Gardner W. S. Swan
(74) *Attorney, Agent, or Firm* — NSIP Law (57) ABSTRACT

Provided is a printed circuit board including a laminate that is formed by vertically stacking a plurality of insulating layers including a rigid insulating layer, a flexible insulating layer having a first region in vertical contact with at least one of the plurality of insulating layers and a second region located on an outer side of the laminate, and a first electronic element embedded in the flexible insulating layer.

21 Claims, 9 Drawing Sheets

(56) References Cited

U.S. PATENT DOCUMENTS

| | | | |
|---|---|---|---|
| 2012/0091594 A1* | 4/2012 | Landesberger | H01L 23/5389 257/774 |
| 2012/0132458 A1* | 5/2012 | Sekine | H05K 1/0393 174/254 |
| 2014/0345911 A1* | 11/2014 | Lee | H05K 3/4691 156/60 |
| 2017/0345763 A1* | 11/2017 | Cheah | H01L 23/4985 |
| 2018/0130757 A1* | 5/2018 | Haba | H01L 23/562 |
| 2019/0141836 A1* | 5/2019 | Gavagnin | H01L 21/4857 |
| 2019/0287927 A1* | 9/2019 | Iyer | H01L 23/562 |
| 2020/0163203 A1* | 5/2020 | Park | H05K 1/0277 |

* cited by examiner

FLEXIBLE PRINTED CIRCUIT BOARD WITH EMBEDDED ELECTRONIC ELEMENT

CROSS-REFERENCE TO RELATED APPLICATIONS

This application claims the benefit under 35 USC § 119(a) of Korean Patent Application No. 10-2018-0154648, filed on Dec. 4, 2018, the entire disclosure of which is incorporated herein by reference for all purposes.

BACKGROUND

1. Field

The following description relates to a printed circuit board.

2. Description of Related Art

With the continued growth and development of the smartphone market, technologies for improving the performance of smartphones and similar devices, and for reducing the thickness of printed circuit boards (PCBs) is in demand. Technologies related to radio frequency printed circuit boards (RFPCBs) is being conducted for the thinning, miniaturization, and fine-scaling of PCBs.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a printed circuit board includes a laminate that is formed by vertically stacking a plurality of insulating layers including a rigid insulating layer, a flexible insulating layer having a first region in vertical contact with at least one of the plurality of insulating layers, and a second region located on an outer side of the laminate, and a first electronic element embedded in the flexible insulating layer.

A cavity may be formed in the flexible insulating layer, and the first electronic element may be configured to be inserted into the cavity.

At least one mounting pad may be formed on a bottom surface of the cavity.

The first electronic element may be configured to be mounted on the at least one mounting pad.

A first part of the mounting pad may be located inside the cavity and a second part of the mounting pad may be located outside the cavity.

The cavity may be filled with a filling member.

The flexible insulating layer may include a thermoplastic resin layer and a thermosetting resin layer, which are vertically stacked.

A coverlay may be stacked on the second region of the flexible insulating layer located on the outer side of the laminate.

The plurality of insulating layers may include the rigid insulating layer and a flexible layer, and the flexible layer is more flexible than the rigid insulating layer.

The flexible layer may include a thermoplastic resin layer and a thermosetting resin layer.

A second electronic element may be mounted on one surface of the laminate.

In a general aspect, a printed circuit board includes a rigid portion, and a flexible portion, wherein a first electronic element is embedded in the flexible portion.

A cavity may be formed in the flexible portion, and the first electronic element may be configured to be inserted into the cavity.

At least one mounting pad may be formed on a bottom surface of the cavity.

The first electronic element may be configured to be mounted on the at least one mounting pad.

A first part of the mounting pad may be located inside the cavity and a second part of the mounting pad may be located outside the cavity.

A second electronic element may be mounted on one surface of the rigid portion.

In a general aspect, a method of manufacturing a printed circuit board includes forming a laminate by vertically stacking a plurality of insulating layers including a rigid insulating layer, forming a flexible insulating layer having a first region in vertical contact with at least one of the plurality of insulating layers, and a second region located on an outer side of the laminate, and embedding a first electronic element in the flexible insulating layer.

A coverlay may be stacked on the second region of the flexible insulating layer located on the outer side of the laminate.

The plurality of insulating layers may include the rigid insulating layer and a flexible layer, and the flexible layer may be more flexible than the rigid insulating layer.

Other features and aspects will be apparent from the following detailed description, the drawings, and the claims.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Unless otherwise defined, all terms, including technical and scientific terms, used herein have the same meaning as commonly understood by one of ordinary skill in the art to which this disclosure pertains after an understanding of the present disclosure. Terms, such as those defined in commonly used dictionaries, are to be interpreted as having a meaning that is consistent with their meaning in the context of the relevant art and the present disclosure, and are not to be interpreted in an idealized or overly formal sense unless expressly so defined herein.

Figure 1A:
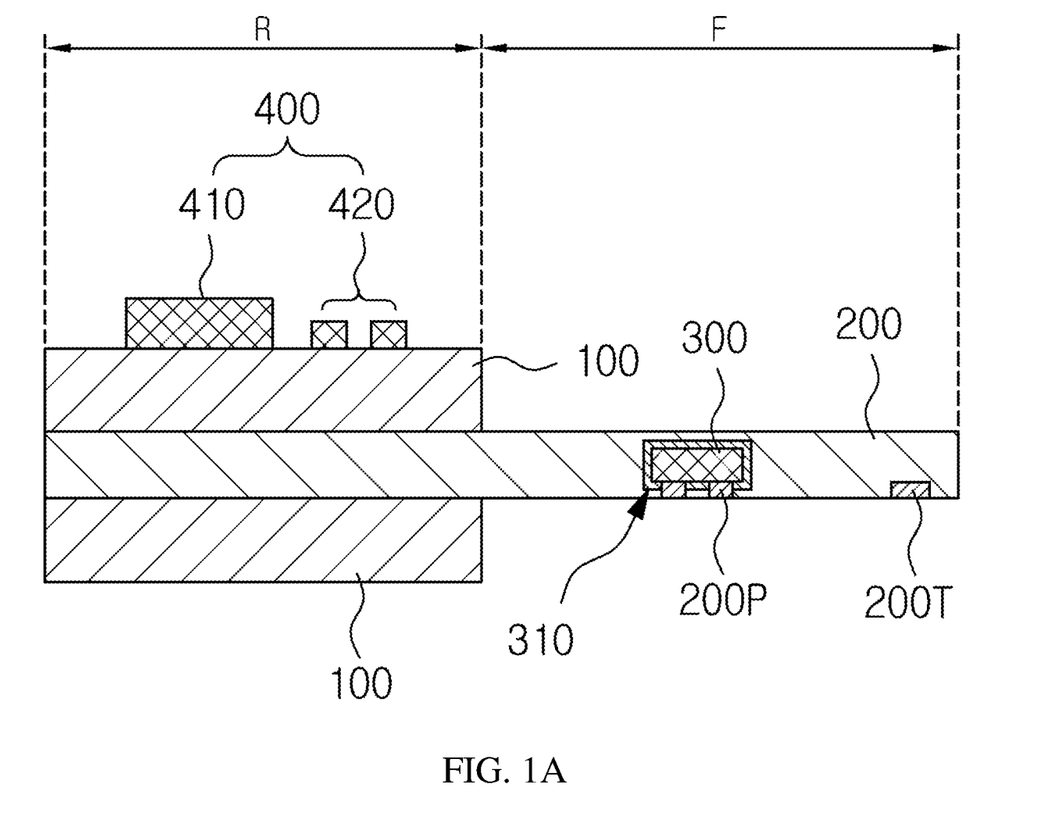
FIGS. 1A and 1B are diagrams illustrating an example of a printed circuit board.
Figure 1B:
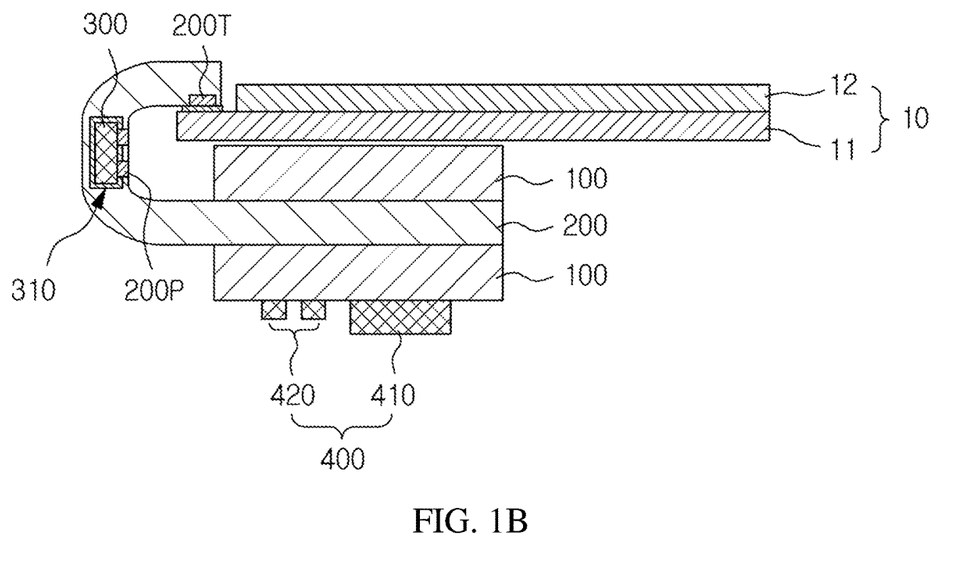

FIGS. 1A and 1B are diagrams illustrating an example of a printed circuit board (PCB).

The PCB according to the first example includes a rigid portion R and a flexible portion F, and the PCB is a rigid flexible board in which the rigid portion R and the flexible portion F are integrally formed. This PCB may be distinguished from a board in which a rigid board and a flexible board are separately manufactured and then combined with each other through a soldering bonding process or similar processes.

Referring to FIG. 1A, the PCB according to an example may include the rigid portion R and the flexible portion F. A first electronic element 300 may be embedded in the flexible portion F.

The rigid portion R may be composed of a plurality of rigid insulating layers 100, and a flexible insulating layer 200, while the flexible portion F may be composed of the flexible insulating layer 200. In an example, the flexible insulating layer 200 may be formed over the rigid portion R and the flexible portion F. Circuits may be formed in the plurality of insulating layers 100 and the flexible insulating layer 200. In particular, the circuit formed in the flexible insulating layer 200 may include a straight circuit line connecting the rigid portion R and the flexible portion F.

The rigid insulating layer may be formed of an insulating material with a relatively low bendability, which may include an epoxy resin and/or an imidazole resin. However, the composition of the rigid insulating layer is not limited thereto. The rigid insulating layer may include a fiber reinforcing material such as glass fiber and may be a pre-preg, which is an epoxy resin containing the fiber reinforcing material. The rigid insulating layer may contain inorganic fillers.

The flexible insulating layer 200 may be formed of an insulating material that is more bendable and flexible than the insulating material of the rigid insulating layer, and may include, as an example, at least one of polyimide (PI), liquid crystal polymer (LCP), polytetrafluoroethylene (PTFE), Teflon, perfluoroalkoxy (PFA), polyphenylene sulfide (PPS), polyphenylene ether (PPE), and polyphenylene oxide (PPO).

A connection terminal 200T may be formed at an end of the flexible insulating layer 200. The connection terminal 200T may be buried in the flexible insulating layer 200 or may protrude from the flexible insulating layer 200. In an example, the connection terminal 200T may be partially buried in the flexible insulating layer 200. The connection terminal 200T may be connected to an external device. For example, the external device may be an external board (e.g., a main board) or a display unit 10, but is not limited thereto.

The display unit 10 may include a display panel 11, and the display panel 11 may be a light-emitting diode (LED) panel, an organic light-emitting diode (OLED) panel, an electrophoretic display panel, an electrochromic display (ECD), or the like. Additionally, the display unit 10 may include a touchscreen panel 12.

The flexible insulating layer 200 may extend toward the display unit 10, and may be coupled to a terminal of the display unit 10. In this example, the connection terminal 200T of the flexible insulating layer 200 may be bonded to the terminal of the display unit 10 using a conductive member CM including a low melting point metal. The connection terminal 200T of the flexible insulating layer 200 may be coupled to the display panel 11 of the display unit 10.

The first electronic element 300 may be located inside the flexible insulating layer 200. A cavity 310 may be formed in the flexible insulating layer 200, and the first electronic element 300 may be inserted into the cavity 310. The first electronic element 300 may be an integrated circuit (IC). In detail, the first electronic element 300 may be a device for driving the display unit 10, and may include, for example, a display driver IC (DDI), a touch display driver IC (TDDI), and the like.

A mounting pad 200P for mounting the first electronic element 300 may be formed on the bottom surface of the cavity 310. A portion of the mounting pad 200P may be located inside the cavity 310, and the remaining portion may be located outside the cavity 310. That is, as viewed in the sectional view, a boundary line of the cavity 310 may be located between an upper surface of the mounting pad 200P and a lower surface of the mounting pad 200P.

The PCB according to the first example may further include a second electronic element 400. The second electronic element 400 may be mounted on the rigid portion R. The second electronic element 400 may include an IC 410 such as a power management IC (PMIC) and may also include a passive device 420 such as a capacitor.

Referring to FIG. 1B, when the PCB is coupled to the display unit 10, the flexible portion F, i.e., the flexible insulating layer 200 may be bent, and the rigid portion R may be disposed on one surface of the display unit 10. The rigid portion R may be located on a rear surface of the display unit 10, and the flexible portion F may be bent in a U-shape to be coupled to the display unit 10. In an example, the first electronic element 300 may be embedded in the bent flexible insulating layer 200.

The display unit 10 may include a display panel 11 and a touchscreen panel 12. Although not shown, the display unit 10 may further include a glass cover on a surface where a user touches the touchscreen.

The elements in FIGS. 1A and 1B are illustrated in an exaggerated manner, and the size and thickness of the elements may be different from the sizes and thicknesses shown in FIG. 1.

Figure 2A:
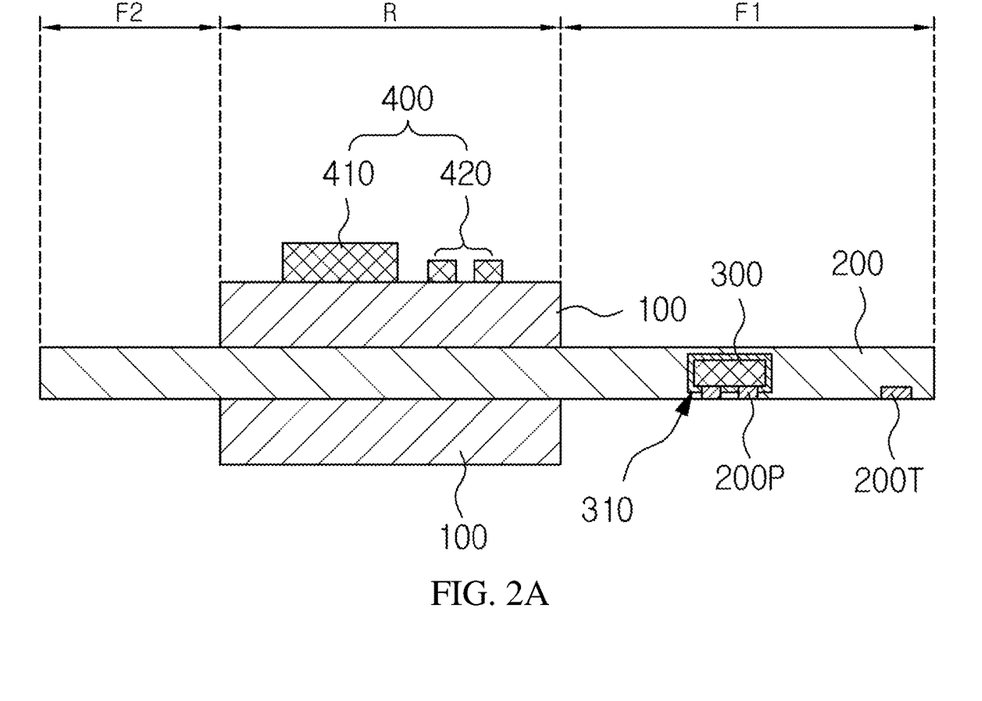
FIGS. 2A and 2B are diagrams illustrating an example of a printed circuit board.
Figure 2B:
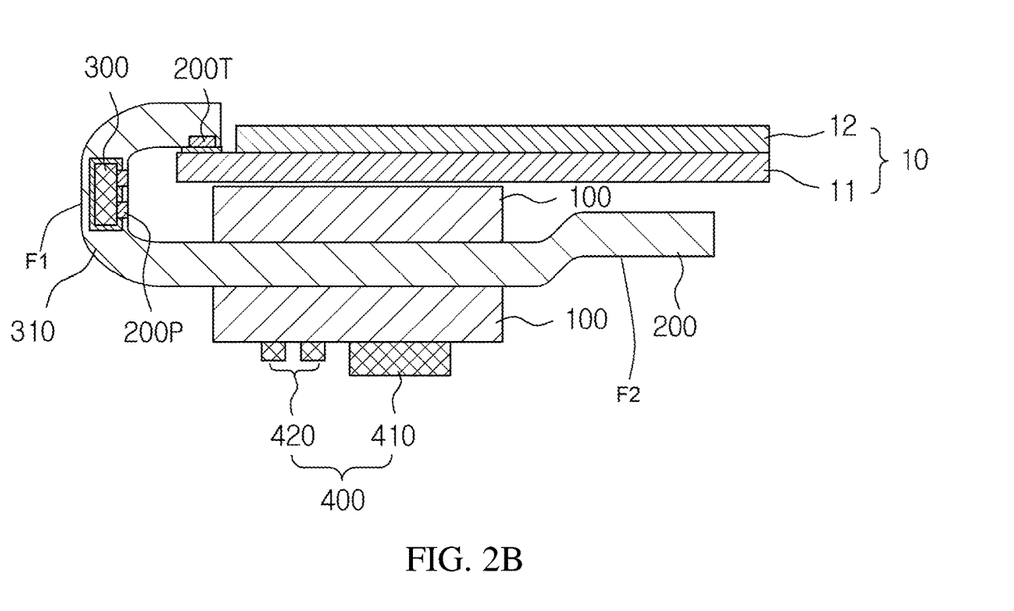

FIGS. 2A and 2B are diagrams illustrating a PCB according to an example.

Referring to FIG. 2A, the PCB according to the second example is similar to the PCB illustrated in FIGS. 1A and 1B except that the flexible insulating layer 200 may extend to a first side and a second side of the rigid portion R. In this example, the PCB may include one rigid portion R and two flexible portions F1 and F2 (i.e., a first flexible portion F1 and a second flexible portion F2). The first electronic element 300 may be embedded in the first flexible portion F1, which extends from a first side of the rigid portion R. The first flexible portion F1 may be coupled to an external device such as the display unit 10, and may perform the same function as the flexible portion F which has been described in FIGS. 1A and 1B. The second flexible portion F2 extends from a second side of the rigid portion R, and may be coupled to an external device other than the display unit 10, for example, to a main board.

Figure 3:
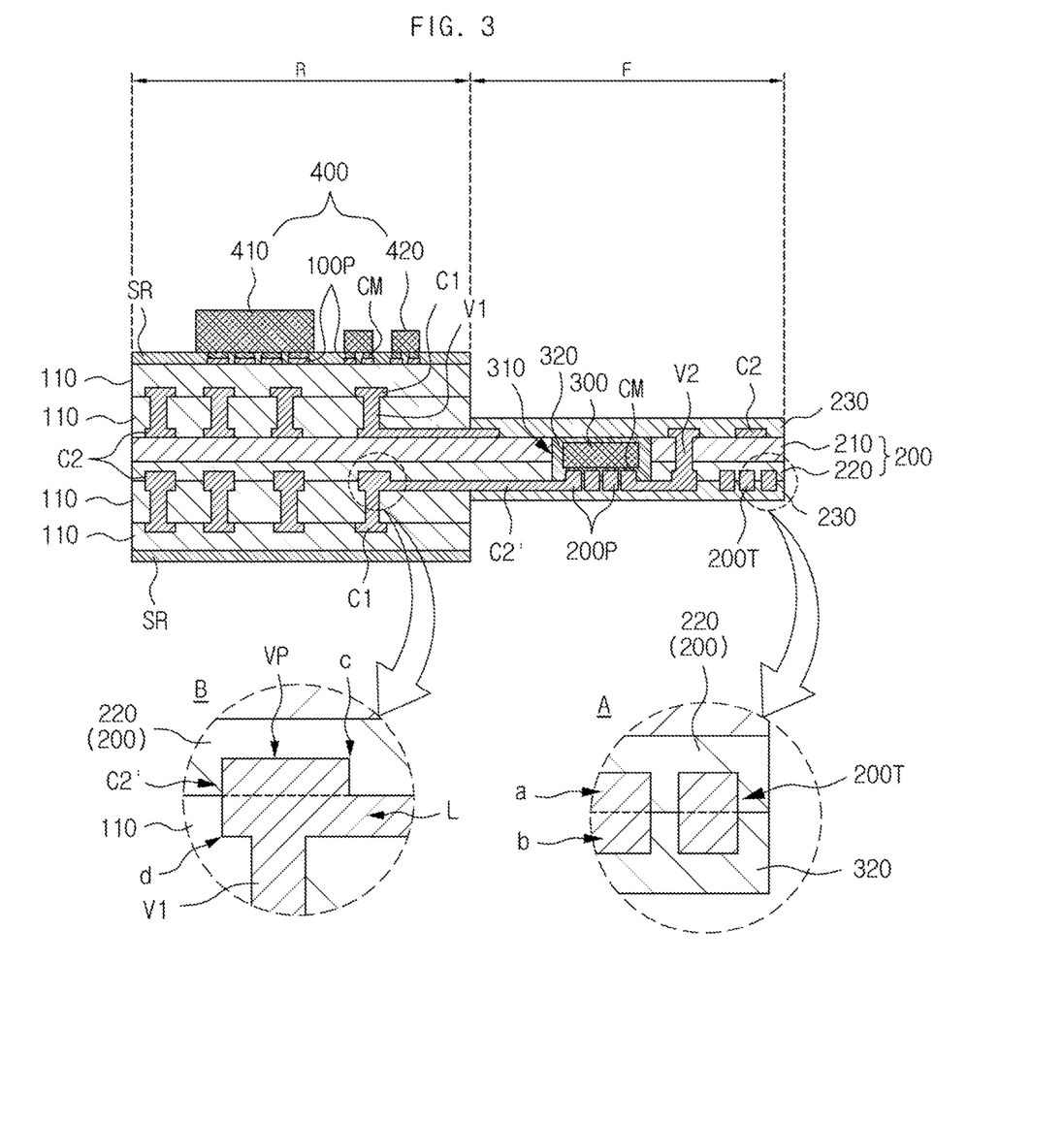
FIG. 3 is a diagram illustrating an example of a printed circuit board.

FIG. 3 is a diagram illustrating an example of a PCB according to a third example.

The PCB according to the third example includes a rigid portion R and a flexible portion F and may be a rigid flexible board in which the rigid portion R and the flexible portion F are integrally formed. This PCB is distinguished from a board in which a rigid board and a flexible board are separately manufactured and then combined with each other through soldering bonding process or similar processes.

Referring to FIG. 3, the PCB according to the third example may include the rigid portion R and the flexible portion F, and a first electronic element 300 may be embedded in the flexible portion F.

In detail, the PCB according to the third example may include a laminate, a flexible insulating layer 200, and the first electronic element 300.

The laminate may be included in the rigid portion R and may be formed by vertically stacking a plurality of insulating layers, including a rigid insulating layer 110. That is, the laminate may include the plurality of insulating layers that are vertically stacked, and at least one of the plurality of insulating layers may be the rigid insulating layer 110. For example, all of the insulating layers may be the rigid insulating layers 110. Alternatively, some of the insulating layers may be the rigid insulating layers 111, and other insulating layers may be layers that are more bendable and flexible than the rigid insulating layers 110. In the laminate, the layer that is more bendable and flexible than the rigid insulating layer 110 may be called a "flexible layer."

This example may be characterized in that all of the plurality of insulating layers are the rigid insulating layers 110.

The rigid insulating layers 110 may be formed of an insulating material with a relatively low bendability, which may include an epoxy resin and/or an imidazole resin, but is not limited thereto. The rigid insulating layers 110 may include a fiber reinforcing material such as glass fiber and may be a pre-preg, which is an epoxy resin containing the fiber reinforcing material. The rigid insulating layers 110 may contain inorganic fillers. The rigid insulating layers 110 may be formed of a material with a low dielectric dissipation factor (Df), and the Df of the rigid insulating layers 110 may be less than, or equal to, 0.003, but the example is not limited thereto.

A solder resist layer SR may be stacked on both sides of the laminate. The solder resist layer SR may be stacked on the outermost rigid insulating layer 110. The solder resist layer SR may be a rigid resin layer and may be photosensitive.

The flexible insulating layer 200 may be included in the rigid portion R, and the flexible portion F and may be formed of an insulating material that is more bendable and flexible than the rigid insulating layer 110. The flexible insulating layer 200 may include at least one of PI, LCP, PTFE, Teflon, PFA, PPS, PPE, and PPO. The Df of the flexible insulating layer 200 may be less than or equal to 0.003, but the examples are not limited thereto.

The flexible insulating layer 200 may have a partial region in vertical contact with at least one of the plurality of insulating layers (the rigid insulating layers 110) and the remaining region located on an outer side of the laminate. The partial region of the flexible insulating layer 200 may form the rigid portion R of the PCB, and the remaining region of the flexible insulating layer 200 located outside the laminate may form the flexible portion F of the PCB.

The flexible insulating layer 200 may be located inside the laminate, and the partial region of the flexible insulating layer 200 may be in vertical contact with two of the plurality of rigid insulating layers 110 of the laminate. That is, the flexible insulating layer 200 may be interposed between the two rigid insulating layers 110.

As shown in FIG. 3, the same number of rigid insulating layers 111 may be stacked on both sides of the flexible insulating layer 200. In this example, the PCB may be implemented as a symmetrical structure. However, this is only an example, and unlike the example in FIG. 3, different numbers of rigid insulating layers 110 may be stacked on both sides of the flexible insulating layer 200. In this example, the PCB may be implemented as an asymmetrical structure.

In addition, the flexible insulating layer 200 may be stacked on an outermost side of the laminate. Here, the partial region of the flexible insulating layer 200 may be in vertical contact with one rigid insulating layer 110. The rigid insulating layers 110 may be stacked on only one side of the flexible insulating layer 200. In this example, an asymmetrical PCB may be implemented.

A connection terminal 200T may be formed at an end of the flexible insulating layer 200, and in particular, at an end located on the outer side of the laminate. The connection terminal 200T may be buried in the flexible insulating layer 200 or may protrude from the flexible insulating layer 200. In an example, the connection terminal 200T may be partially buried in the flexible insulating layer 200. The connection terminal 200T may be connected to an external device. For example, the external device may be an external board (e.g., a main board) or a display unit.

The display unit may include a display panel, and the display panel may be an LED panel, an OLED panel, an electrophoretic display panel, an ECD, or the like. Also, the display unit may include a touchscreen panel.

The flexible insulating layer 200 may extend toward the display unit and may be coupled to a terminal of the display unit. In this example, the connection terminal 200T of the flexible insulating layer 200 may be bonded to the terminal of the display unit using a conductive member CM including a low melting point metal. The connection terminal 200T of the flexible insulating layer 200 may be coupled to the display panel of the display unit.

The flexible insulating layer 200 may include a thermoplastic resin layer 210 and a thermosetting resin layer 220. The thermoplastic resin layer 210 and the thermosetting resin layer 220 may be vertically stacked to constitute or form the flexible insulating layer 200. The thermosetting resin layer 220 may have an adhesive property, and thus may serve as an adhesive layer. A liquid crystal polymer (LCP) or the like may be used as the thermoplastic resin layer 210, and a polyphenylene ether (PPE) or the like may be used as the thermosetting resin layer 220. However, the examples are not limited thereto. Meanwhile, the thermoplastic resin layer 210 may have a larger thickness than the thermosetting resin layer 220, but the examples are not limited thereto.

A flexible coverlay 230 may be stacked on an outer side surface of the flexible insulating layer 200. The coverlay 230 may protect a circuit C2 formed in the flexible insulating layer 200.

The first electronic element 300 may be embedded in the flexible portion F, and may be located inside the flexible insulating layer 200. However, this is only an example, and the first electronic element 300 may be partially embedded in the flexible insulating layer 200. The first electronic element 300 may be an IC. In detail, the first electronic element 300 may be a device for driving the display unit, and may include, for example, a DDI, a TDDI, and the like.

A cavity 310 may be formed in the flexible insulating layer 200, and the first electronic element 300 may be inserted into the cavity 310. The cavity 310 may pass through the flexible insulating layer 200 entirely in the thickness direction. The cavity 310 may be formed to have a larger size than a size of first electronic element 300. Also, the first electronic element 300 may have a smaller height than the cavity 310 and may not protrude further than the flexible insulating layer 200. The cavity 310 may be filled with a filling member 320. That is, the first electronic element 300 may be inserted into the cavity 310, and the remaining space may be filled with the filling member 320. The filling member 320 may include a resin material such as epoxy or the like, and any material used for encapsulation of electronic elements may be used as the filling member.

When the coverlay 230 is stacked on an outer side surface of the flexible insulating layer 200, the filling member 320 filled in the cavity 310 may be in contact with the coverlay 230.

A mounting pad 200P may be formed on the bottom surface of the cavity 310, and the first electronic element 300 may be disposed on the mounting pad 200P. A conductive member CM may be interposed between the first electronic element 300 and the mounting pad 200P to electrically connect the first electronic element 300 and the mounting pad 200P.

The PCB according to the third example may further include a second electronic element 400. The second electronic element 400 may be mounted on the rigid portion R. That is, the second electronic element 400 may be mounted on one surface of the laminate. The second electronic element 400 may include an IC 410 such as a PMIC, and may also include a passive device 420 such as a capacitor.

Circuits may be formed in the rigid insulating layer 110 and the flexible insulating layer 200. The circuits may contain a metal such as copper, nickel, aluminum, silver, palladium, gold, and the like. The circuits may be classified as follows: a circuit formed on one surface of the rigid insulating layer 110 may be referred to as a first circuit C1, and a circuit formed on one surface of the flexible insulating layer 200 may be referred to as a second circuit C2. However, this classification is for convenience of description. The second circuit C2 may have a smaller pitch than the first circuit C1. In particular, the pitch of the second circuit C2 located in the flexible portion F may be smallest.

The first circuit C1 may be formed on one surface of the rigid insulating layer 110 and may be included in the rigid portion R. When the rigid insulating layer 110 is provided with a plurality of rigid insulating layers, the first circuit C1 may be formed in each of the plurality of rigid insulating layers 110. The first circuits C1 located in different layers may be electrically connected to each other through a first via V1 passing through the rigid insulating layer 110. A portion of the first circuit C1 located on the outermost rigid insulating layer 110 may be a mounting pad 110P for mounting the second electronic element 400. When the solder resist layer SR is stacked on the outermost rigid insulating layer 110, the solder resist layer SR may cover the outermost first circuit C1, and an opening may be formed on the solder resist layer SR to expose the mounting pad 100P.

Also, a conductive member CM may be located on the opening to electrically connect the mounting pad 100P and the second electronic element 400.

The second circuit C2 may be formed on one surface or both surfaces of the flexible insulating layer 200 and may be included in the rigid portion R and the flexible portion F. The second circuit C2 may include a straight circuit line formed over the rigid portion R and the flexible portion F to connect the rigid portion R and the flexible portion F. The second circuits C2 formed in different layers may be electrically connected to each other through a second via V2 passing through the flexible insulating layer 200. Also, the first circuit C1 and the second circuit C2 may be electrically connected to each other through the first via V1 passing through the rigid insulating layer 110.

When the flexible insulating layer 200 includes the thermoplastic resin layer 210 and the thermosetting resin layer 220, the second circuit C2 may be formed, not at an interface between the thermoplastic resin layer 210 and the thermosetting resin layer 220, but on an outer side surface of the thermoplastic resin layer 210 and an outer side surface of the thermosetting resin layer 220. Also, the second via V2 may pass through both of the thermoplastic resin layer 210 and the thermosetting resin layer 220.

A portion of the second circuit C2 may be the above-described connection terminal 200T. When a coverlay 230 is stacked on the flexible insulating layer 200, the coverlay 230 may cover the second circuit C2, and an opening may be formed on the coverlay 230 to expose the connection terminal 200T.

A portion of the second circuit C2 may be a mounting pad 200P for mounting the first electronic element 300. The mounting pad 200P may be located on the bottom surface of the cavity 310. At least one mounting pad 200P may have a partial region located inside the cavity 310 and the remaining region located outside the cavity 310. The partial region of the mounting pad 200P located inside the cavity 310 may be buried in the filling member 320 in the cavity 310, and the remaining region of the mounting pad 200P located outside the cavity 310 may be located inside the coverlay 230. That is, the mounting pad 200P may be formed between the filling member 320 and the coverlay 230. In this example, the mounting pad 200P is covered with the coverlay 230 and thus may not be exposed outward.

At least a portion of the second circuit C2 may include a circuit line buried in the flexible insulating layer 200.

For example, among the second circuits C2 in FIG. 3, at least a portion of a circuit formed on a lower surface of the flexible insulating layer 200 (hereinafter, referred to as a lower circuit C2') is buried in the flexible insulating layer 200. In the following description, a region buried in the flexible insulating layer 200 may be called a buried portion, and a region not buried in the flexible insulating layer 200 may be called a protruding portion. When the flexible insulating layer 200 includes the thermoplastic resin layer 210 and the thermosetting resin layer 220, the buried portion may be buried in the thermosetting resin layer 220.

The lower circuit C2' may include a circuit line including the buried portion and the protruding portion. Here, the buried portion located in the rigid portion R is located in the flexible insulating layer 200, and the protruding portion located in the rigid portion R is located in the rigid insulating layer 110. In this example, in the lower circuit C2', the circuit line located in the rigid portion R may be formed over the flexible insulating layer 200 and the rigid insulating layer 110. The buried portion located in the flexible portion F may be located in the flexible insulating layer 200, and the protruding portion located in the flexible portion F may be located outside the flexible insulating layer 200, for example, in the coverlay 230. In this example, in the lower circuit C2', the circuit line located in the flexible portion F is formed over the flexible insulating layer 200 and the coverlay 230.

In particular, in the lower circuit C2', the connection terminal 200T of the flexible insulating layer 200 and the pad of the via (the first via V1 and/or the second via V2) may each include a buried portion and a protrusion portion. For example, the connection terminal 200T of the flexible insulating layer 200 may include a buried portion "a" and a protrusion portion "b" (see the partial enlarged view A of FIG. 3), and the pad VP of the via may include a buried portion "c" and a protrusion portion "d" (see the partial enlarged view B of FIG. 3).

Here, in a circuit line region connected to the connection terminal 200T of the flexible insulating layer 200 and the pad of the via (the first via V1 and/or the second via V2), there may be only a protrusion portion without a buried portion. For example, referring to the partial enlarged view B of FIG. 3, a circuit line region L connected to the pad VP of the via may not be buried in the flexible insulating layer 200, but may be formed to protrude from one surface of the flexible insulating layer 200 outward. However, in an example, unlike FIG. 3, the circuit line region L connected to the pad VP of the via may have both of the buried portion and the protruding portion.

For example, the lower circuit C2' may include i) a circuit line with a portion having both of a buried portion and a protruding portion and the remaining portion having only a protruding portion. Also, the lower circuit C2' may include ii) a circuit line having a buried portion and a protruding portion as a whole. Also, the lower circuit C2' may include iii) a circuit line having only a buried portion as a whole.

As described above, the lower circuit C2' may be implemented in various manners. However, a common feature in all of the three examples is that at least a portion of the lower circuit C2' may be buried in the flexible insulating layer 200. The lower circuit C2', in particular, the region having both of the buried portion and the protruding portion may have a larger thickness than the second circuit C2 formed in another layer, but the examples are not limited thereto.

As described above, the mounting pad 200P may include a region located inside the cavity 310 (a region located inside the filling member 320) and a region located outside the cavity 310 (a region located inside the coverlay 230), which is similar to the pad VP of the via and the connection terminal 200T. The region located inside the cavity 310 may have a similar shape to the above-described buried portion, and the region located outside the cavity 310 may have a similar shape to the above-described protruding portion.

The second circuit C2 may have a smaller pitch than the first circuit C1. In particular, the pitch of the second circuit C2 located in the flexible portion F may be smallest. Also, the pitch of the lower circuit C2' among the second circuits C2 located in the flexible portion F may be smallest.

Figure 4:
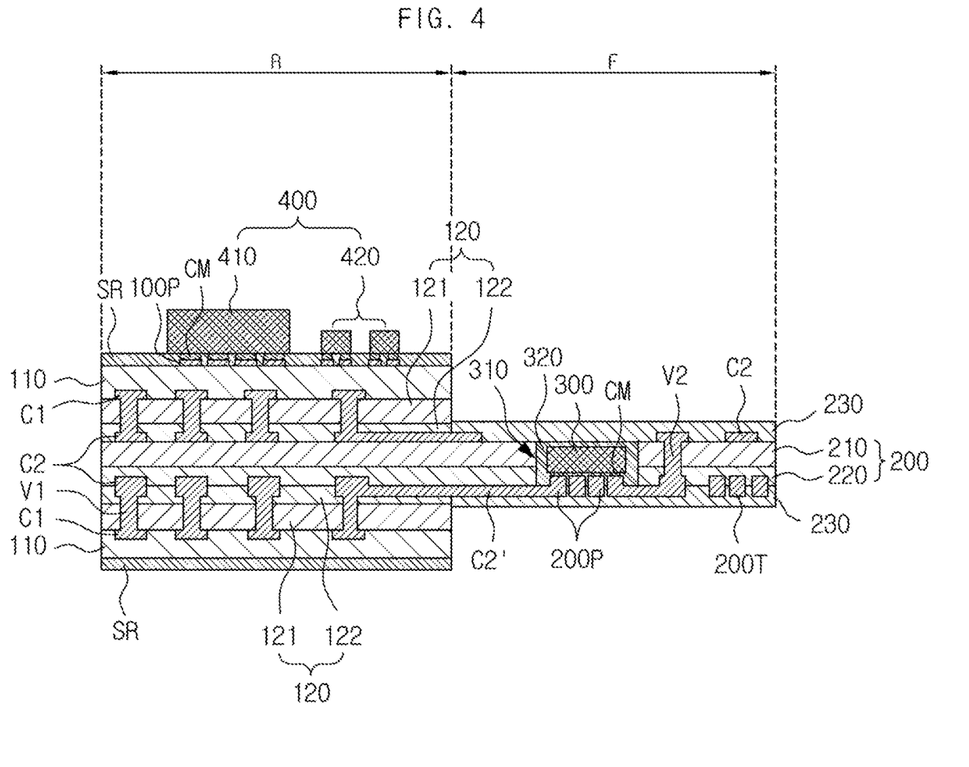
FIG. 4 is a diagram illustrating an example of a printed circuit board.

FIG. 4 is a diagram illustrating a PCB according to a fourth example.

Referring to FIG. 4, in a rigid portion R of the PCB according to the fourth example, some of a plurality of insulating layers may be rigid insulating layers 110, and the others of the plurality of insulating layers may be flexible layers 120. The flexible layers 120 may be disposed more inwardly than the rigid insulating layer 110, and thus may be disposed closer to a flexible insulating layer 200. In an example, the rigid insulating layer 110 may be located at the outermost layer of the plurality of insulating layers. Although the flexible layer 120 is included in the rigid portion R, the laminate may have a lower bendability than the flexible insulating layer 200 because of the rigid insulating layer 110. The rigid portion R and the flexible portion F of the PCB are relative concepts, and the laminate is the rigid portion R even when the flexible layer 120 is included in the laminate.

The flexible layer 120 may be formed of an insulating material that is more bendable and flexible than the rigid insulating layer 110. The flexible insulating layer 200 may include at least one of PI, LCP, PTFE, Teflon, PFA, PPS, PPE, and PPO. The Df of the flexible layer 120 may be less than or equal to 0.003, but the example is not limited thereto. The flexible layer 120 may be formed of the same material as the flexible insulating layer 200.

The flexible layer 120 may include a thermoplastic resin layer 121 and a thermosetting resin layer 122. The thermoplastic resin layer 121 and the thermosetting resin layer 122 may be vertically stacked to constitute, or form, the flexible layer 120. The thermosetting resin layer 122 may have an adhesive property and thus may serve as an adhesive layer. LCP or similar materials may be used as the thermoplastic resin layer 121, and PPE or similar materials may be used as the thermosetting resin layer 122, but the example is not limited thereto. The thermoplastic resin layer 121 may have a larger thickness than the thermosetting resin layer 122, but the example is not limited thereto.

When the flexible layer 120 includes the thermoplastic resin layer 121 and the thermosetting resin layer 122, the thermoplastic resin layer 121 may be located more outward than the thermosetting resin layer 122. Thus, the flexible insulating layer 200 may be in contact with the thermosetting resin layer 122 of the flexible layer 120 in the laminate.

In detail, when the flexible insulating layer 200 includes a thermoplastic resin layer 210 and a thermosetting resin layer 220, the thermoplastic resin layer 210 of the flexible insulating layer 200 and the thermosetting resin layer 122 of the flexible layer 120 may be in vertical contact with each other on an upper side (a first side) of the flexible insulating layer 200, and the thermosetting resin layer 220 of the flexible insulating layer 200 and the thermosetting resin layer 122 of the flexible layer 120 may be in vertical contact with each other on a lower side (the other side or a second side) of the flexible insulating layer 200. The thermosetting resin layer 220 of the flexible insulating layer 200 and the thermosetting resin layer 122 of the flexible layer 120 may be formed of the same material and may be integrated with each other such that an interface may not be formed therebetween. However, this is only an example, and the thermosetting resin layer 220 of the flexible insulating layer 200 and the thermosetting resin layer 122 of the flexible layer 120 may be formed from different materials.

In this example, a first circuit C1 may be formed on one surface of the thermoplastic resin layer 210. The first circuit C1 may be formed on one surface of the thermoplastic resin layer 210 to protrude toward the rigid insulating layer 110 (to be buried in the rigid insulating layer 110).

Among second circuits C2, the second circuit C2 located in the rigid portion R may be formed on both surfaces of the flexible insulating layer 200 to come into contact with the thermosetting resin layer 122 of the flexible layer 120. Also, the second circuit C2 located in the flexible portion F may be formed on both surfaces of the flexible insulating layer 200 to come into contact with a coverlay 230.

Among the second circuits C2, a lower circuit C2' may include a circuit line including a buried portion (buried in the flexible insulating layer 200), and a protruding portion (protruding from the flexible insulating layer 200). The buried portion located in the rigid portion R is buried in the thermosetting resin layer 220 of the flexible insulating layer 200, and the protruding portion located in the rigid portion R may be located in the thermosetting resin layer 122 of the flexible layer 120.

Figure 5:
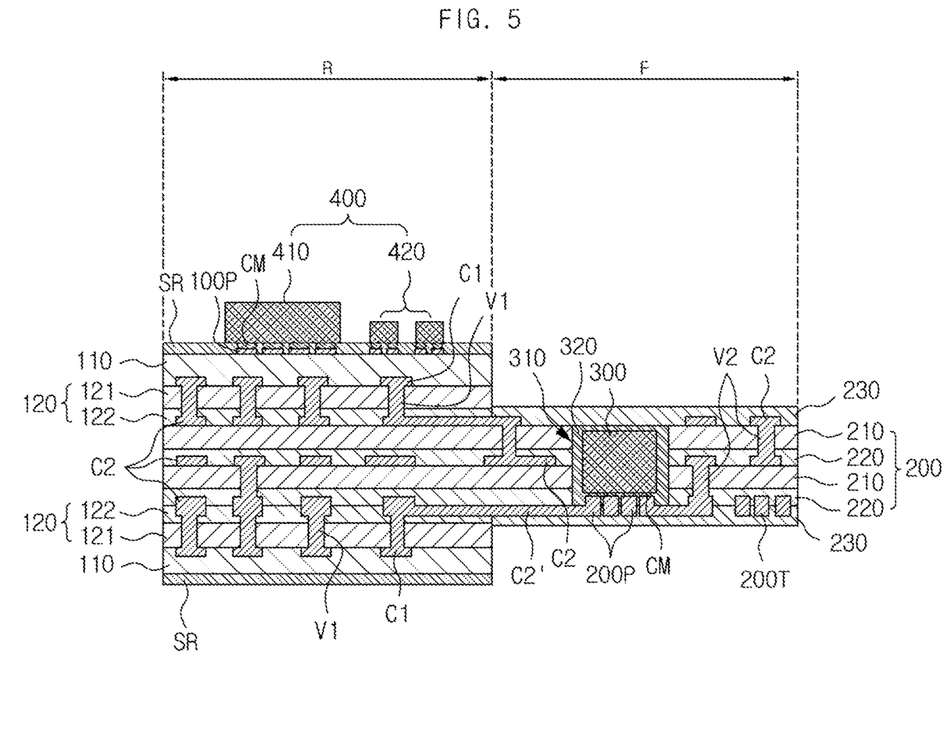
FIG. 5 is a diagram illustrating an example of a printed circuit board.

FIG. 5 is a diagram illustrating a PCB according to a fifth example.

Referring to FIG. 5, in the PCB according to the fifth example, a flexible insulating layer 200 includes a plurality of thermoplastic resin layers 210 and a plurality of thermosetting resin layers 220. The plurality of thermoplastic resin layers 210 and the plurality of thermosetting resin layers 220 may be alternately stacked to constitute, or form, the flexible insulating layer 200. In this example, second circuits C2 may have a three-layer structure. The uppermost second circuit C2 may be formed on one surface of the thermoplastic resin layer 210 to protrude outward, and the second circuit C2 located in the middle layer may be formed on one surface of the thermoplastic resin layer 210 and buried in the thermosetting resin layer 220. Also, the lowermost second circuit C2' may have the same configuration as the lower circuit that has been described in the previous examples. A coverlay 230 may cover a resin layer located on the outermost layer, and may cover the outermost second circuit C2.

A cavity 310 for mounting a first electronic element 300 may pass through all of the thermoplastic resin layers 210 and the thermosetting resin layers 220 of the flexible insulating layer 200.

The numbers of thermoplastic resin layers 210 and thermosetting resin layers 220 of the flexible insulating layer 200 may be variously determined depending on the number of necessary circuit layers, the size of the first electronic element 300, or the like.

Figure 6:
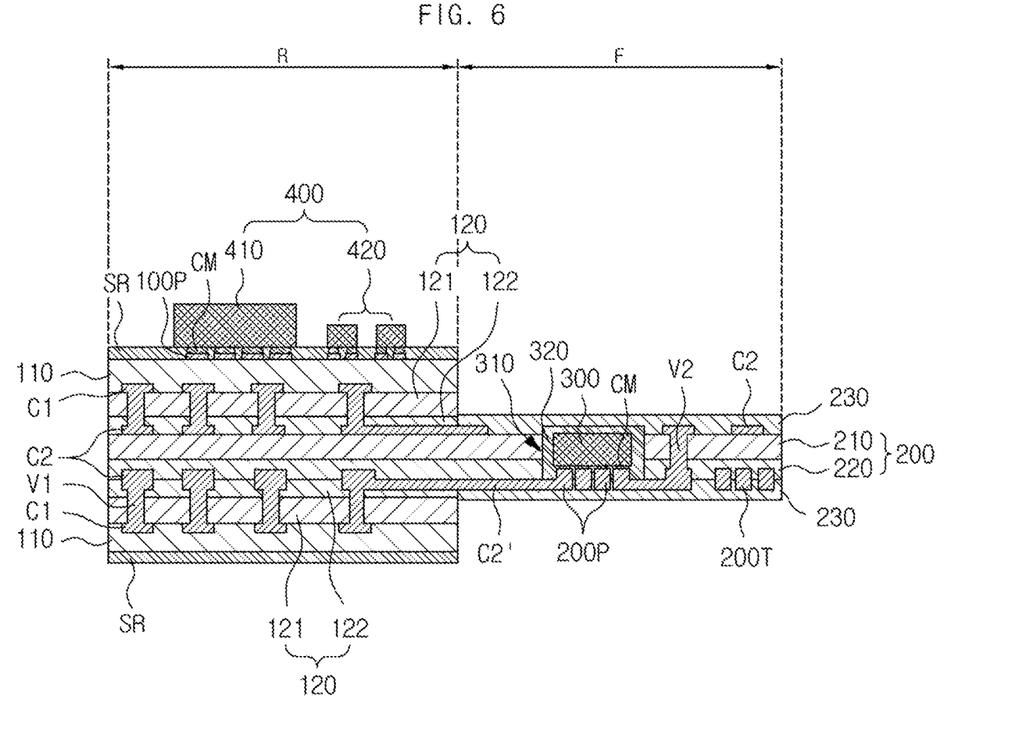
FIG. 6 is a diagram illustrating an example of a printed circuit board.

FIG. 6 is a diagram illustrating a PCB according to a sixth example.

Referring to FIG. 6, in the PCB according to the sixth example, an upper surface of a first electronic element 300 is located higher than an upper surface of a flexible insulating layer 200. For example, the thickness of the first electronic element 300 is larger than the thickness of the flexible insulating layer 200. In this example, a cavity 310 may pass through the entirety of the flexible insulating layer 200. The first electronic element 300 may be inserted into the cavity 310, and the cavity 310 may be filled with a filling member 320. The filling member 320 may be located higher than the cavity 310. In this example, the filling member 320 may pass through, or be embedded in, a coverlay 230.

FIGS. 7A-7H are diagrams illustrating a method of manufacturing the PCB of the example. FIGS. 7A-7H illustrate a method of manufacturing the PCB according to the fourth example disclosed in FIG. 4, but the PCB manufacturing method with reference to FIGS. 7A-7H may be applied to other examples.

Figure 7A:
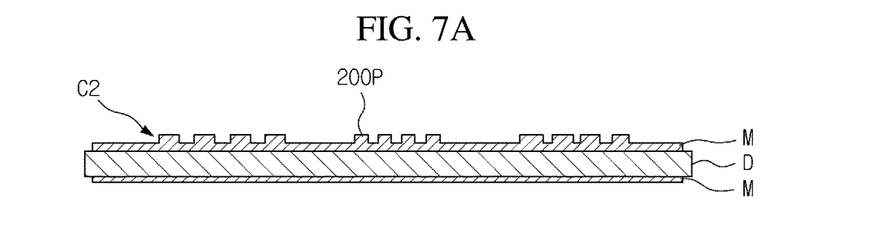
FIGS. 7A to 7H are diagrams illustrating a method of manufacturing a printed circuit board according to an example.

Referring to FIG. 7A, a second circuit C2 may be formed on a detachable carrier D. Here, a metal layer M may be provided on the detachable carrier D, and the second circuit C2 may be formed using the metal layer M as a seed layer using a semi-additive process (SAP) or a modified semi-additive process (mSAP). The second circuit C2 may be formed on both surfaces of the detachable carrier D, and thus two identical PCBs may be manufactured. However, FIG. 7A shows only one surface in detail. The second circuit C2 may include a mounting pad 200P.

Figure 7B:
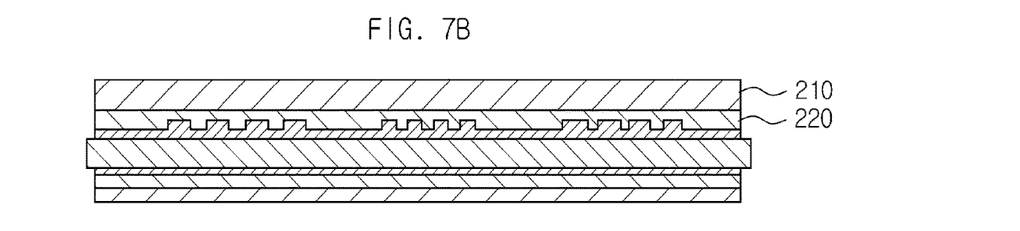

Referring to FIG. 7B, a flexible insulating layer 200 may be stacked thereon. In detail, a thermosetting resin layer 220 may be first stacked to cover the second circuit C2, and a thermoplastic resin layer 210 may be stacked on the thermosetting resin layer 220. The thermoplastic resin layer 210 may secure adhesion due to the thermosetting resin layer 220.

Figure 7C:
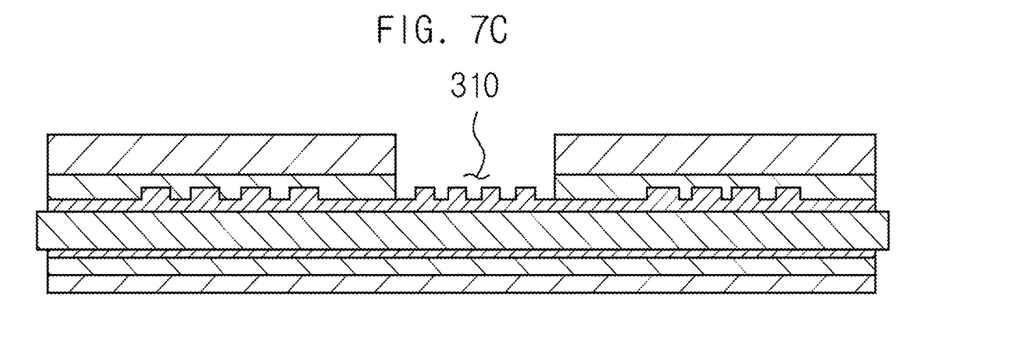

Referring to FIG. 7C, a cavity 310 may then be formed in the flexible insulating layer 200. In detail, the cavity 310 may be formed to pass through both of the thermoplastic resin layer 210 and the thermosetting resin layer 220. The mounting pad 200P may be exposed through the cavity 310. The mounting pad 200P is formed to protrude from the detachable carrier D and thus is located inside the cavity 310.

Figure 7D:
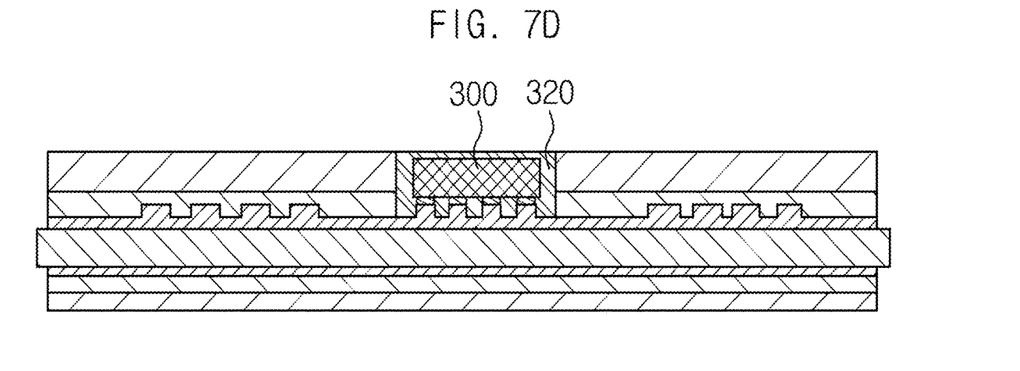

Referring to FIG. 7D, a first electronic element 300 may then be inserted into the cavity 310, and a conductive member CM is interposed between the first electronic element 300 and the mounting pad 200P. Thus, the first electronic element 300 and the mounting pad 200P may be coupled to each other. The cavity 310 may then be filled with a filling member 320 after the first electronic element 300 is inserted into the cavity 310.

Figure 7E:
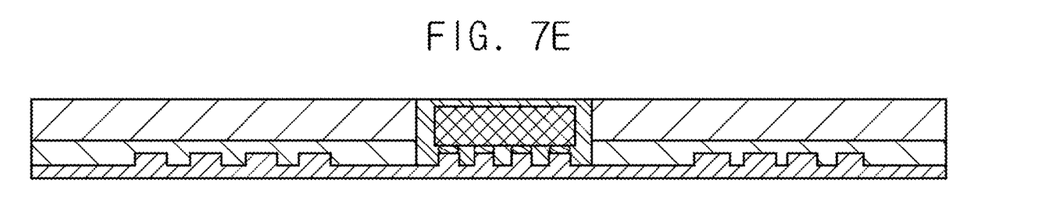

Referring to FIG. 7E, the detachable carrier D is removed. In this example, the metal layer M may remain in place. In detail, the detachable carrier D may be composed of a resin material and a plurality of metal layers stacked on both surfaces of the resin material. When the detachable carrier D is removed, some of the resin material and the plurality of metal layers may be removed, and thus some of the metal layers may remain in place.

Figure 7F:
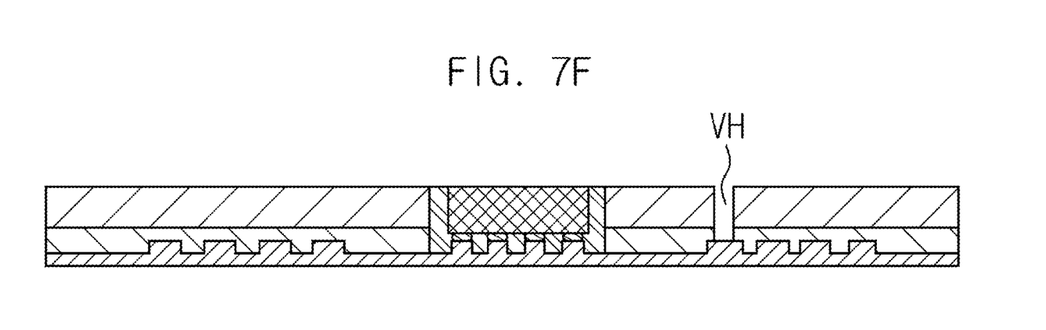

Referring to FIG. 7F, a via hole VH for forming a second via V2 is formed. The via hole VH may be formed through laser processing. In FIG. 7F, the via hole VH may have a certain diameter vertically. However, unlike FIG. 7F, the via hole VH may have the maximum diameter on the processing surface. In this example, the via hole VH may narrow in diameter in a downward direction.

Figure 7G:
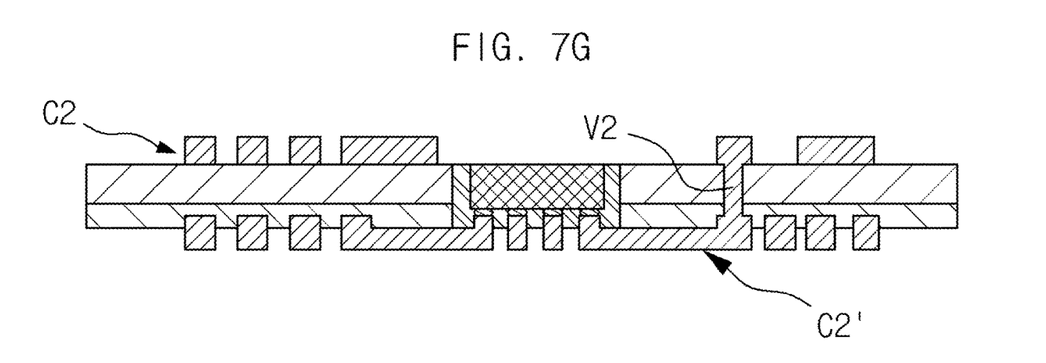

Referring to FIG. 7G, a second circuit C2 is further formed. In particular, in FIG. 7G, the upper second circuit C2 is formed on an upper surface of the flexible insulating layer 200 while a lower second circuit (a lower circuit C2')

is further formed on the bottom surface of the flexible insulating layer 200. Thus, the lower circuit C2' may have a buried portion and a protruding portion. That is, the buried portion of the lower circuit C2' is formed as shown in FIG. 7A, and the protruding portion of the lower circuit C2' is formed as shown in FIG. 7G. After the protruding portion of the lower circuit C2' is formed, an unnecessary metal layer M is removed by a method such as etching.

Figure 7H:
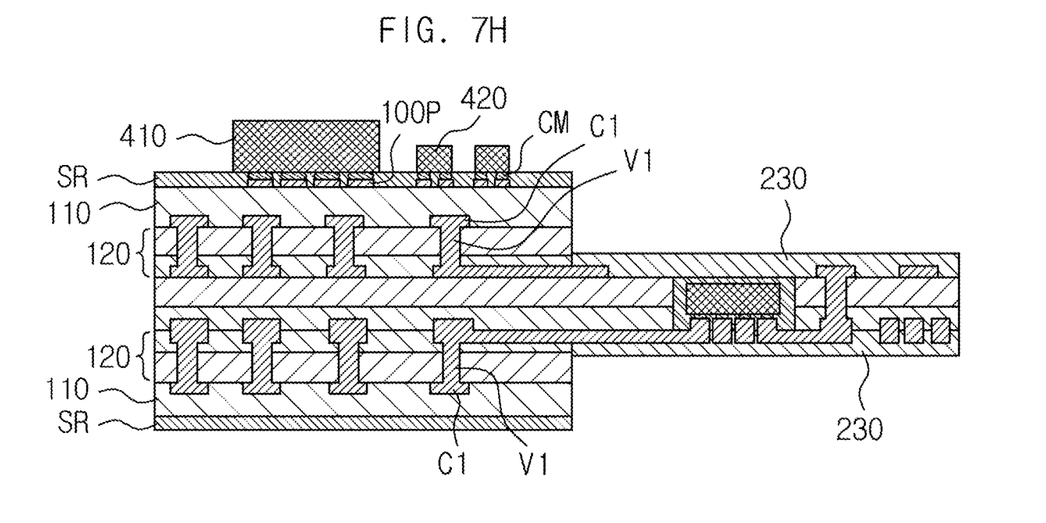

Referring to FIG. 7H, a laminate may be formed by stacking a rigid insulating layer 110 and/or a flexible layer 120 constituting a rigid portion R on the flexible insulating layer 200, and then a first circuit C1 is formed. Here, a first via V1 may also be formed. A solder resist layer SR may be stacked on both surfaces of the laminate, and second electronic elements 400 (410 and 420) may be mounted on one surface of the laminate.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A printed circuit board comprising:
a laminate including a plurality of rigid insulating layers, and a first region of a flexible insulating layer disposed between the plurality of rigid insulating layers;
wherein the flexible insulating layer comprises a second region located on an outer side of the laminate,
wherein a first electronic element and a circuit are embedded in the second region of the flexible insulating layer,
wherein a first portion of the circuit is embedded in the flexible insulating layer, and a second portion of the circuit protrudes from the flexible insulating layer, and
wherein a first end of the first portion is completely enclosed by the flexible insulating layer, and the first portion extends to a second end opposite to the first end to contact the second portion.

2. The printed circuit board of claim 1, wherein a cavity is formed in the flexible insulating layer, and
the first electronic element is configured to be inserted into the cavity.

3. The printed circuit board of claim 2, wherein at least one mounting pad is formed on a bottom surface of the cavity.

4. The printed circuit board of claim 3, wherein the first electronic element is configured to be mounted on the at least one mounting pad.

5. The printed circuit board of claim 4, wherein a first part of the mounting pad is located inside the cavity and a second part of the mounting pad is located outside the cavity.

6. The printed circuit board of claim 2, wherein the cavity is filled with a filling member.

7. The printed circuit board of claim 1, wherein the flexible insulating layer comprises a thermoplastic resin layer and a thermosetting resin layer, which are vertically stacked.

8. The printed circuit board of claim 1, further comprising a coverlay stacked on the second region of the flexible insulating layer located on the outer side of the laminate.

9. The printed circuit board of claim 1, wherein the laminate comprises the plurality of rigid insulating layers, a plurality of flexible layers, and the flexible insulating layer, and
the flexible layers are more flexible than the rigid insulating layers.

10. The printed circuit board of claim 9, wherein the flexible layers comprise a thermoplastic resin layer and a thermosetting resin layer.

11. The printed circuit board of claim 1, further comprising a second electronic element mounted on one surface of the laminate.

12. The printed circuit board of claim 1, wherein the circuit includes a circuit line disposed over the flexible insulating layer.

13. A printed circuit board comprising:
a rigid portion; and
a flexible portion, comprising a first region embedded between layers of the rigid portion,
wherein a first electronic element and a circuit are embedded in a second region of the flexible portion external to the rigid portion,
wherein a first portion of the circuit is embedded in the flexible portion, and a second portion of the circuit protrudes from the flexible portion, and
wherein a first end of the first portion is completely enclosed by the flexible insulating layer, and the first portion extends to a second end opposite to the first end to contact the second portion.

14. The printed circuit board of claim 13, wherein a cavity is formed in the flexible portion, and the first electronic element is configured to be inserted into the cavity.

15. The printed circuit board of claim 14, wherein at least one mounting pad is formed on a bottom surface of the cavity.

16. The printed circuit board of claim 15, wherein the first electronic element is configured to be mounted on the at least one mounting pad.

17. The printed circuit board of claim 15, wherein a first part of the mounting pad is located inside the cavity and a second part of the mounting pad is located outside the cavity.

18. The printed circuit board of claim 13, wherein a second electronic element is mounted on one surface of the rigid portion.

19. A method of manufacturing a printed circuit board, comprising:
disposing a laminate by vertically stacking a first region of a flexible insulating layer between a plurality of rigid insulating regions;
disposing a second region of the flexible insulating layer on an outer side of the laminate; and
embedding a first electronic element and a circuit in the second region of the flexible insulating layer,
wherein a first portion of the circuit is embedded in the flexible insulating layer, and a second portion of the circuit protrudes from the flexible insulating layer, and
wherein a first end of the first portion is completely enclosed by the flexible insulating layer, and the first portion extends to a second end opposite to the first end to contact the second portion.

20. The method of claim 19, further comprising stacking a coverlay on the second region of the flexible insulating layer located on the outer side of the laminate.

21. The method of claim 19, wherein the laminate comprises the plurality of rigid insulating layers, a plurality of flexible layers, and the flexible insulating layer, and the flexible layers are more flexible than the rigid insulating layers.

\* \* \* \* \*